(12) United States Patent
Ohfuku et al.

(10) Patent No.: US 8,292,488 B2
(45) Date of Patent: Oct. 23, 2012

(54) BACKLIGHT UNIT

(75) Inventors: Kazuki Ohfuku, Osaka (JP); Masashi Miwa, Osaka (JP); Masakazu Takeuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 159 days.

(21) Appl. No.: 12/523,235

(22) PCT Filed: Oct. 24, 2007

(86) PCT No.: PCT/JP2007/070709
§ 371 (c)(1),
(2), (4) Date: Jul. 15, 2009

(87) PCT Pub. No.: WO2008/129706
PCT Pub. Date: Oct. 30, 2008

(65) Prior Publication Data
US 2010/0053995 A1 Mar. 4, 2010

(30) Foreign Application Priority Data
Mar. 30, 2007 (JP) .................................. 2007-090873

(51) Int. Cl.
*F21V 7/04* (2006.01)
(52) U.S. Cl. ............................ 362/631; 362/612; 349/65
(58) Field of Classification Search .................. 362/612, 362/631; 349/65
See application file for complete search history.

(56) References Cited

U.S. PATENT DOCUMENTS

| 2002/0015005 A1 | 2/2002 | Imaeda |
| 2004/0080924 A1 | 4/2004 | Chuang |
| 2005/0179850 A1 | 8/2005 | Du |
| 2006/0152944 A1* | 7/2006 | Nakayoshi et al. ........... 362/631 |

FOREIGN PATENT DOCUMENTS

| JP | 2002-72234 A | 3/2002 |
| JP | 2002-72915 A | 3/2002 |
| JP | 2004-146360 A | 5/2004 |
| JP | 2004-214094 A | 7/2004 |
| JP | 2006-309103 A | 11/2006 |

* cited by examiner

*Primary Examiner* — Diane Lee
*Assistant Examiner* — Sean Gramling
(74) *Attorney, Agent, or Firm* — Birch, Stewart, Kolasch & Birch, LLP

(57) ABSTRACT

A backlight unit is provided that, for a case where on a mounting board on which a plurality of point light sources are mounted, an electronic component other than those point light sources is mounted, can reduce the occurrence of uneven luminance, with no increase in the size of the backlight unit. This backlight unit (10) is provided with a PWB (6) having at least an LED mounting region (6a) extending along a side surface (3a) of a light guide plate (3). The LED mounting region (6a) of the PWB (6) is, at an end portion thereof on one side, provided with an FPC mounting region (6b) and is, at an end portion thereof on the other side opposite to the one side, provided with a capacitor mounting region (6c) extending along a side surface (3b) perpendicular to the side surface (3a) of the light guide plate (3).

2 Claims, 6 Drawing Sheets

BACKLIGHT UNIT

TECHNICAL FIELD

The present invention relates to a backlight unit, and more particularly to a backlight unit including a plurality of point-light sources.

BACKGROUND ART

Conventionally, backlight units for liquid crystal display apparatuses that generate light using a plurality of point light sources (for example, see Patent Document 1) have been known. Patent Document 1 discloses a backlight unit for a liquid crystal display apparatus using, as the point light sources, LEDs (light emitting diodes).

FIG. 10 is a plan view schematically showing an example of a structure of the above-described conventional backlight units. With reference to FIG. 10, in the conventional backlight unit, a light guide plate 102, a plurality of LEDs 103 and the like are housed inside a backlight case 101. The light guide plate 102 has a light incident surface 102a formed with a predetermined side surface, and a light emitting surface 102b formed with a front surface. The plurality of LEDs 103, mounted on a same mounting board 104, are arranged such that respective illuminating surfaces 103a thereof face the light incident surface 102a of the light guide plate 102. Although not shown in the figure, an optical sheet is disposed on a side of the light emitting surface (front surface) 102b of the light guide plate 102, and a reflective sheet is disposed on a back surface side opposite to the side of the light emitting surface (front surface) 102b of the light guide plate 102.
[Patent Document 1] JP-A-2006-309103

DISCLOSURE OF THE INVENTION

Problems to be Solved by the Invention

In the conventional backlight unit using the LEDs 103 as the light sources, those LEDs 103 have poor resistance to static electricity; thus an electronic component for coping with static electricity (not shown) may often be mounted on the mounting board 104 on which the LEDs 103 are mounted. In this case, as shown in FIG. 11, when a space 104a for mounting such an electronic component for coping with static electricity is secured on one end portion of the mounting board 104, an area corresponding to an edge portion 102c of the light guide plate 102 becomes dark, with the result that uneven luminance occurs inconveniently.

As a method of mounting the electronic component for coping with static electricity on the mounting board 104, one is conceivable according to which the mounting board 104 is extended in a direction indicated by arrow C (see FIG. 10). However, in this method, a backlight case 101 also needs to be extended in the direction indicated by arrow C; as a result, a backlight unit encounters an additional inconvenience of causing an increase in the size.

The present invention has been devised to solve the above-described inconveniences, and accordingly, an object of the present invention is to provide a backlight unit that, for a case where on a mounting board having a plurality of point light sources mounted thereon, an electronic component other than the point light sources is also mounted, can reduce the occurrence of uneven luminance, with no increase in the size of the backlight unit.

Means for Solving the Problem

To achieve the above object, a backlight unit according to one aspect of the present invention includes: a light guide plate having four side surfaces, of which a predetermined side surface functions as a light incident surface; a mounting board having at least a first mounting region extending along the light incident surface of the light guide plate; and a plurality of point light sources mounted on the first mounting region of the mounting board and arranged at a predetermined interval from each other in a direction in which the first mounting board of the mounting board extends. And the first mounting region of the mounting board is, at an end portion thereof on one side, provided with a power supply region to which electric power driving the plurality of point light sources is supplied, and the first mounting region of the mounting board is, at an end portion thereof on the other side opposite to the one side, provided with a second mounting region extending along a side surface perpendicular to the light incident surface of the light guide plate, and on the second mounting region of the mounting board, an electronic component other than the point light sources is mounted.

As described above, the backlight unit according to the one aspect is structured such that the first mounting region (region having the plurality of point light sources mounted thereon) of the mounting board extending along the light incident surface of the light guide plate is, at the end portion thereof on the one side, provided with the power supply region to which electric power driving the plurality of point light sources is supplied; in this structure, the first mounting region of the mounting board is, at an end portion thereof on the other side opposite to the one side, provided with a second mounting region on which an electronic component other than the point light sources is mounted, thereby to offer the following effects. In a case where on a mounting board on which a plurality of point light sources are mounted, an electronic component for coping with static electricity (an electronic component other than the point light sources) is also mounted so that the point light sources are prevented from being broken due to static electricity, the electronic component for coping with static electricity, when mounted on the second mounting region of the mounting board, needs not be mounted on the first mounting region of the mounting board. Accordingly, it is possible to reduce the inconvenience, as a result of securing a space for mounting the electronic component for coping with static electricity on the first mounting region of the mounting board, of a region corresponding to that space becoming dark. Thus, it is possible to reduce the occurrence of uneven luminance even when an electronic component for coping with static electricity is also mounted on a mounting board having a plurality of point light sources mounted thereon.

In this case, the second mounting region disposed at the end portion, on the other side opposite to the one side, of the first mounting region of the mounting board is so formed as to extend along the side surface perpendicular to the light incident surface of the light guide plate; this helps reduce an increase in the outer dimension of a case member for holding the light guide plate even when the second mounting region in which an electronic component other than the point light sources is mounted is newly disposed on the mounting board. This helps reduce an increase in the size of the backlight unit.

Thus, according to the one aspect, it is possible to reduce, for a case where on the mounting board on which the plurality of point light sources are mounted, an electronic component other than the point light sources is also mounted, the occurrence of uneven luminance, with no increase in the size of a backlight unit.

Preferably, in the backlight unit according to the one aspect as described above, the electronic component other than the point light sources includes an electronic component for coping with static electricity. With this structure, in a case where LEDs (light emitting diodes) with poor resistance to static electricity are used as the point light sources, it is possible to prevent the LEDs from being broken due to static electricity, with no increase in the size of the backlight unit and with reduced occurrence of uneven luminance.

Preferably, the backlight unit according to the one aspect as described above further includes a case member for holding the light guide plate, the case member having a side portion disposed along a side surface of the light guide plate, and in the side portion of the case member, a recessed portion for avoiding contact between the electronic component other than the point light sources and the side portion of the case member is formed. With this structure, it is possible to reduce the inconvenience of breaking the electronic component other than the point light sources owing to the contact between the electronic component other than the point light sources and the side portion of the case member.

In the backlight unit according to the one aspect as described above, the point light sources alone may be mounted on the first mounting region of the mounting board, with no electronic component other than the point light sources mounted thereon. This structure eliminates the need for providing a space for mounting an electronic component other than the point light sources on an endmost portion (a portion in the vicinity of an edge portion of the light guide plate) of the first mounting region of the mounting board; consequently, it is possible to mount a point light source on the endmost portion of the first mounting region of the mounting board. Thus, it is possible to suppress darkening of a region corresponding to the edge portion of the light guide plate. Moreover, there is no need to provide a space for mounting an electronic component other than the point light sources between the point light sources adjacent to each other, making it possible to reduce a distance between the point light sources adjacent to each other. Thus, it is possible to reduce the inconvenience, despite the point light sources arranged linearly, of light incident on the light incident surface of the light guide plate becoming a point shape, owing to a great distance between the point light sources adjacent to each other.

Advantages of the Invention

As described above, according to the present invention, it is possible to easily obtain a backlight unit that, for a case where on a mounting board on which a plurality of point light sources are mounted, an electronic component other than the point light sources is also mounted, can reduce the occurrence of uneven luminance, with no increase in the size of the backlight unit.

LIST OF REFERENCE SYMBOLS

1 Backlight case (case member)
1a, 1b, 1c, 1d Side portions
1f Recessed portion
3 Light guide plate
3a Side surface (light incident surface)
3b, 3c, 3d Side surfaces
4 LEDs (point light sources)
6 PWB (printed wiring board)
6a, 61a, 62a LED mounting regions (first mounting regions)
6b, 61b FPC mounting regions (power supply regions)
6c, 61c, 62c Capacitor mounting regions (second mounting regions)
8 Capacitor (electronic component)
61, 62 FPC (mounting board)
62b Power supply region

BEST MODE FOR CARRYING OUT THE INVENTION

Hereinafter, structures of a backlight unit according to this embodiment and a liquid crystal display apparatus using that backlight unit will be described with reference to FIGS. 1 to 5.

Figure 1:
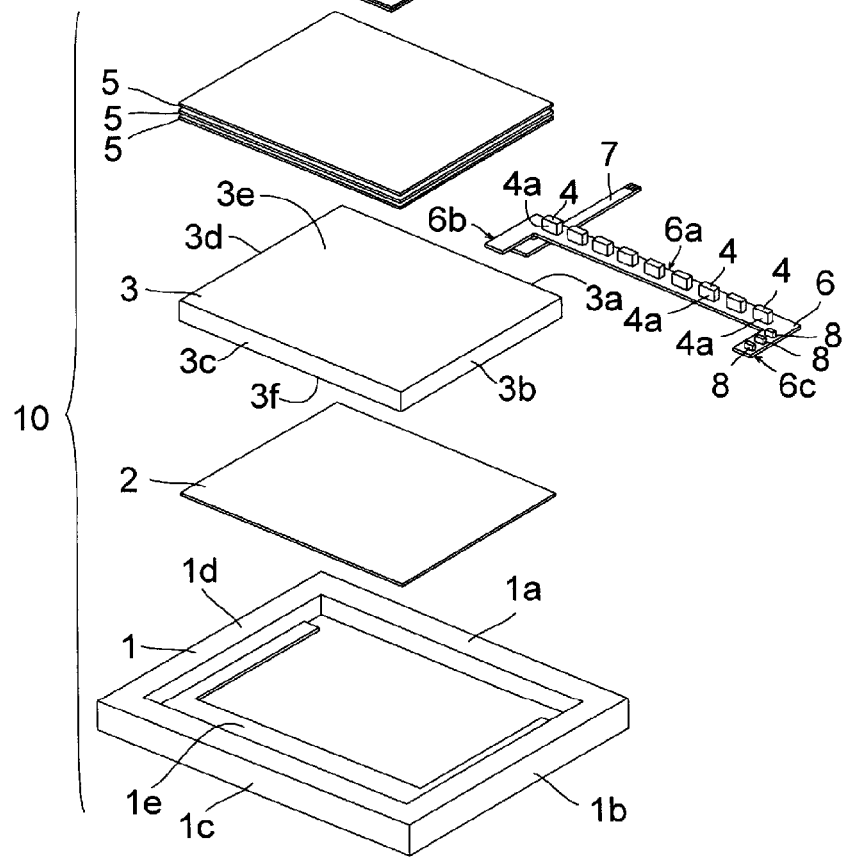
FIG. 1 is an exploded perspective view of a liquid crystal display apparatus using a backlight unit according to a first embodiment of the present invention.

As shown in FIG. 1, a liquid crystal display apparatus using a backlight unit 10 of this embodiment is used with the backlight unit 10 disposed on the back side of a liquid crystal display panel 20. And the backlight unit 10 of this embodiment is so formed as to shine planar light on the liquid crystal display panel 20 from the back side of the liquid crystal display panel 20. Hereinafter, a structure of the backlight unit 10 of this embodiment will be described in detail.

As shown in FIG. 1, the backlight unit 10 of this embodiment includes: a backlight case 1; a reflective sheet 2; a light guide plate 3; a plurality of LEDs (light emitting diodes) 4; and a plurality of optical sheets 5. The backlight case 1 is an example of a "case member" of the present invention, and the LED 4 is an example of a "point light source" of the present invention.

The backlight case 1 is composed of a resin-molded product and the like, and has a shape such that four side portions 1a-1d are coupled together so as to form a frame shape. Out of the four side portions 1a-1d of the backlight case 1, the three side portions 1b-1d other than the side portion 1a are formed integrally with a placement portion 1e protruding inwardly. And the members forming the backlight unit 10 (reflective sheet 2, light guide plate 3, plurality of LEDs 4, and plurality of optical sheets 5) are held within a region (housing region)

surrounded by the four side portions 1a-1d of the backlight case 1. More specifically, the reflective sheet 2, light guide plate 3, and plurality of optical sheets 5 are laid sequentially in this order on the placement portion 1e of the backlight case 1. Moreover, the plurality of LEDs 4 are disposed on a side of the side portion 1a of the backlight case 1.

The reflective sheet 2 is composed of a sheet member that can reflect light, and is so disposed as to cover a back surface 3f of the light guide plate 3. The provision of such the reflective sheet 2 permits light emitted from the back surface 3f of the light guide plate 3 to be reflected thereon; this makes it possible to guide again the light emitted from the back surface 3f of the light guide plate 3 into the light guide plate 3. That is, it is possible to increase light use efficiency.

The light guide plate 3 located on the front side of the reflective sheet 2 is composed of a transparent member formed out of a transparent resin and the like, and has at least four side surfaces 3a-3d. When the light guide plate 3 is held within the housing region of the backlight case 1, the four side surfaces 3a-3d of the light guide plate 3 are disposed along the corresponding side portions 1a-1d of the backlight case 1. That is, the backlight case 1 of this embodiment has the side portions 1a-1d disposed along the side surfaces 3a-3d of the light guide plate 3. And the side surface 3a of the light guide plate 3 disposed along the side portion 1a of the backlight case 1 functions as a light incident surface for guiding light generated by the plurality of LEDs 4 into the light guide plate 3.

Moreover, the light guide plate 3 has, in addition to the aforementioned side surfaces 3a-3d, one front surface 3e and one back surface 3f. The front surface 3e of the light guide plate 3 functions as a light emitting surface for emitting the light guided into the light guide plate 3 in an illuminating direction (direction toward the liquid crystal display panel 20). As mentioned earlier, the back surface 3f of the light guide plate 3 is covered by the reflective sheet 2.

The plurality of LEDs 4, mounted on a hardened PWB (printed wiring board) 6, are disposed on a side of the side portion 1a of the backlight case 1. The PWB 6 is an example of a "mounting board" of the present invention.

Figure 2:
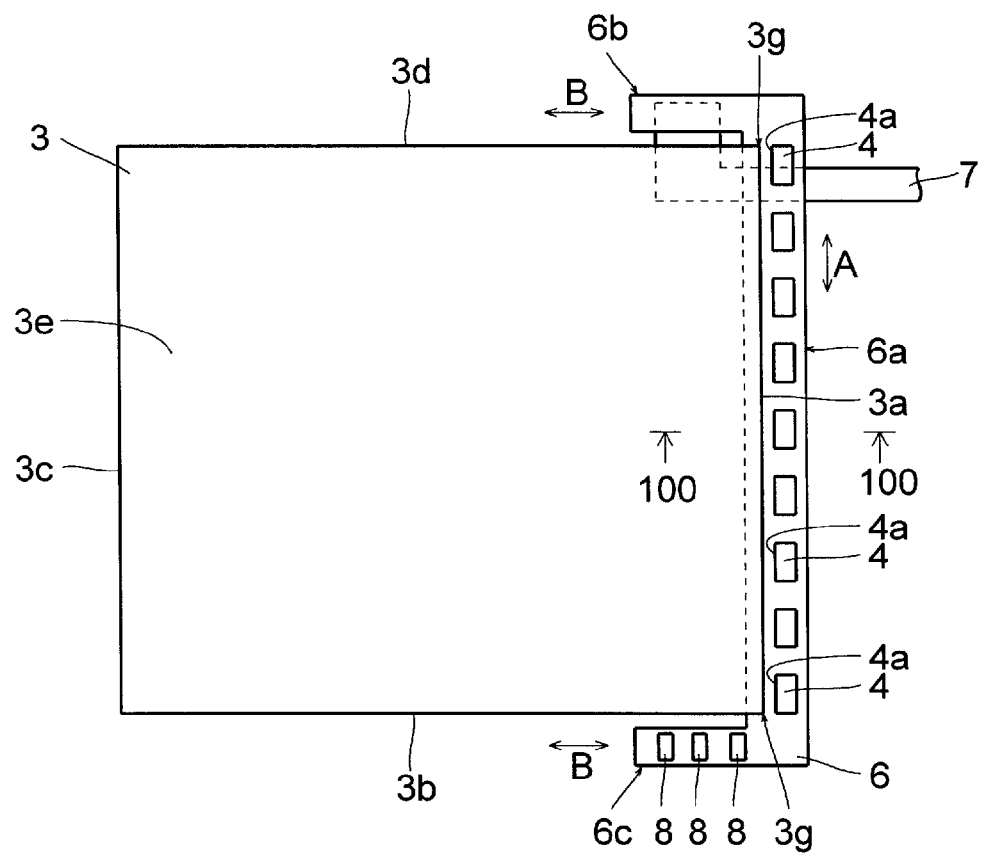
FIG. 2 is a plan view (with a backlight case omitted therefrom) illustrating in detail a structure of the backlight unit according to the first embodiment of the present invention.

In this embodiment, as shown in FIGS. 1 and 2, the PWB 6, on which the plurality of LEDs 4 are mounted, includes three mounting regions 6a-6c, and is formed in a U shape as seen in a plan view.

More specifically, the mounting region 6a of the PWB 6 is a region on which the plurality of LEDs 4 are mounted (hereinafter, called LED mounting region 6a), and is so formed in an oblong shape as to extend in a predetermined direction (direction A shown in FIG. 2). The plurality of LEDs 4 mounted on the LED mounting region 6a of the PWB 6 are arranged at a predetermined interval from each other in a direction in which the LED mounting region 6a extends (direction A shown in FIG. 2). The LED mounting region 6a is an example of a "first mounting region" of the present invention.

Moreover, the mounting region 6b of the PWB 6 is a region on which an FPC (flexible printed wiring board) 7 for supplying electric power driving the plurality of LEDs 4 is mounted (hereinafter, called FPC mounting region 6b), and is provided integrally with an end portion, on one side, of the LED mounting region 6a. Moreover, the FPC mounting region 6b of the PWB 6 is so formed as to extend in a direction (direction B shown in FIG. 2) intersecting the direction in which the LED mounting region 6a extends. The FPC 7 mounted on the FPC mounting region 6b of the PWB 6 is connected to a driving circuit board 23, which will be described later. The FPC mounting region 6b is an example of a "power supply region" of the present invention.

Moreover, the mounting region 6c of the PWB 6 is a region in which a plurality of capacitors 8 for coping with static electricity are mounted (hereinafter called capacitor mounting region 6c), and is provided integrally with an end portion, at the other side opposite to the one side, of the LED mounting region 6a. Moreover, the capacitor mounting region 6c of the PWB 6 is so formed as to extend in a direction (direction B shown in FIG. 2) intersecting the direction in which the LED mounting region 6a extends. The plurality of capacitors 8 for coping with static electricity mounted on the capacitor mounting region 6c of the PWB 6 have a function of preventing the plurality of LEDs 4 from being broken due to static electricity. The capacitor mounting region 6c is an example of a "second mounting region" of the present invention, and the capacitor 8 is an example of an "electronic component other than point light sources" of the present invention.

Figure 3:
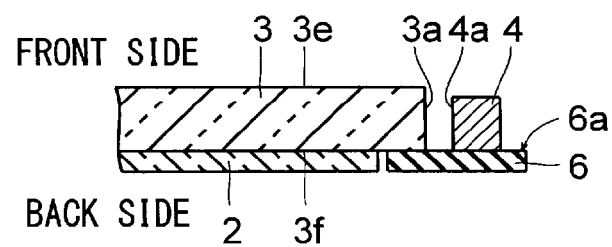
FIG. 3 is a cross-sectional view taken along line 100-100 in FIG. 2.

Moreover, as shown in FIGS. 2 and 3, a predetermined region of the LED mounting region 6a of the PWB 6 adheres to an end portion of the back surface 3f of the light guide plate 3 so that the LED mounting region 6a extends along the light incident surface 3a of the light guide plate 3 and that illuminating surfaces 4a of the LEDs 4 mounted on the LED mounting region 6a face the light incident surface 3a of the light guide plate 3. In this way, the PWB 6 (plurality of LEDs 4) are fixed to the light guide plate 3. Although not shown in the figures, adhesion of the PWB 6 to the light guide plate 3 is performed via double-sided tape and the like.

Moreover, in this embodiment, as shown in FIG. 2, with the PWB 6 adhering to the light guide plate 3, the FPC mounting region 6b of the PWB 6 is disposed along the side surface 3d of the light guide plate 3, and the capacitor mounting region 6c of the PWB 6 is disposed along the side surface 3b of the light guide plate 3. That is, in this embodiment, the capacitor mounting region 6c of the PWB 6 extends along the side surface 3b perpendicular to the side surface (light incident surface) 3a of the light guide plate 3.

Figure 4:
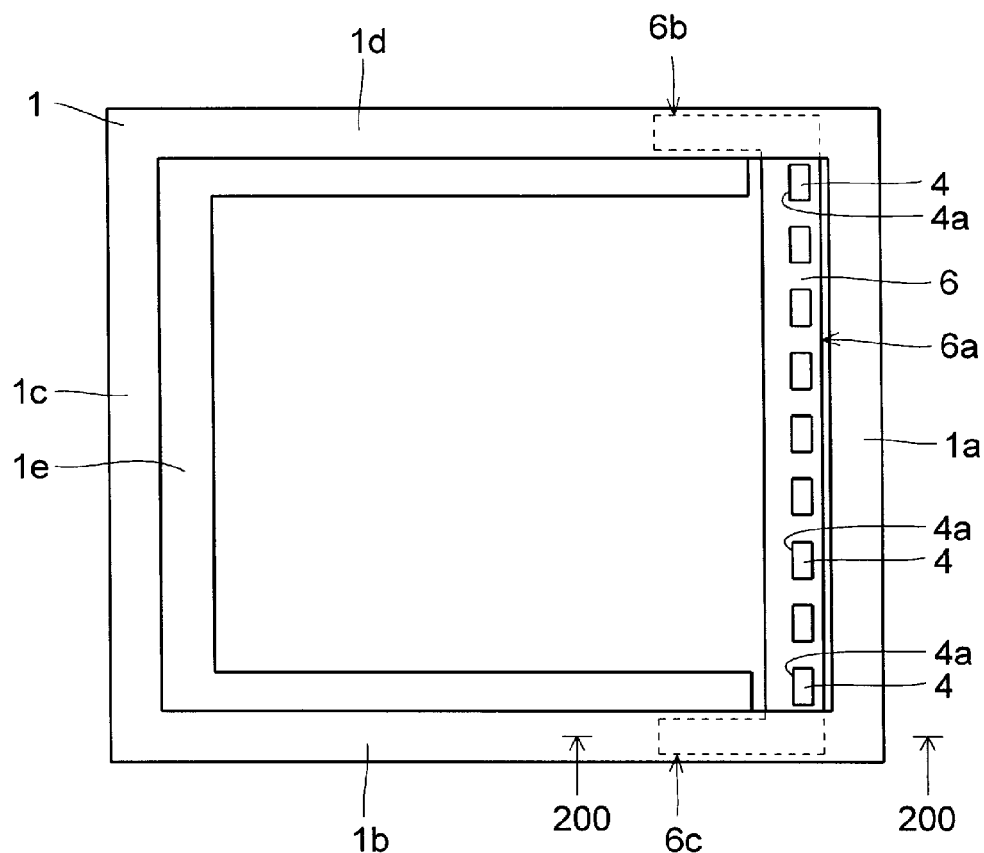
FIG. 4 is a plan view (with a light guide plate omitted therefrom) illustrating in detail a structure of the backlight unit according to the first embodiment shown in FIG. 1.
Figure 5:
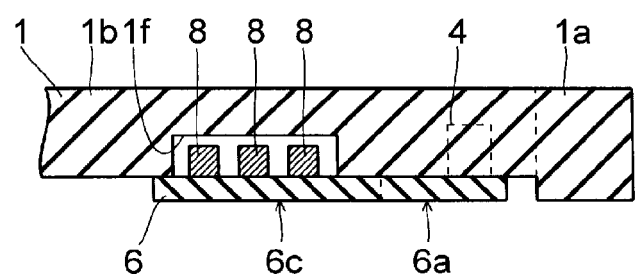
FIG. 5 is a cross-sectional view taken along line 200-200 in FIG. 4.

When the capacitor mounting region 6c of the PWB 6 is disposed along the side surface 3b of the light guide plate 3 as described above, the capacitor mounting region 6c of the PWB 6 and the side portion 1b of the backlight case 1 overlap each other as shown in FIG. 4. Thus, in this embodiment, as shown in FIG. 5, a recessed portion 1f for avoiding contact with the plurality of capacitors 8 mounted on the capacitor mounting region 6c of the PWB 6 is formed in the side portion 1b of the backlight case 1.

Moreover, in this embodiment, as shown in FIG. 2, on the LED mounting region 6a of the PWB 6, no electronic component other than the LEDs 4 is mounted, and the LEDs 4 alone are mounted. Thus, in this embodiment, there is no need to provide a space for mounting an electronic component other than the LEDs 4, on an endmost portion (a portion in the vicinity of an edge portion 3g of the light guide plate 3) of the LED mounting region 6a of the PWB 6. This makes it possible to mount the LED 4 on the endmost portion of the LED mounting region 6a of the PWB 6 (on the portion in the vicinity of the edge portion 3g of the light guide plate 3), thus preventing a region corresponding to the edge portion 3g of the light guide plate 3 from becoming dark.

Moreover, there is no need to provide a space for mounting an electronic component other than the LEDs 4 between the LEDs 4 adjacent to each other; this helps reduce a distance between the LEDs 4 adjacent to each other. Thus, it is possible to reduce the inconvenience, despite the plurality of LEDs 4 arranged linearly, of light incident on the light incident surface 3a of the light guide plate 3 becoming a point shape owing to a great distance between the LEDs 4 adjacent to each other.

Moreover, as shown in FIG. 1, the plurality of optical sheets 5 located on the front side of the light guide plate 3 include a diffusion sheet, a prism sheet and the like. The plurality of optical sheets 5 performs diffusion, etc. of light emitted from the front surface (light emitting surface) 3e of the light guide plate 3.

Moreover, the liquid crystal display panel 20 located on the front side of the backlight unit 10 includes a liquid crystal layer (not shown), a pair of substrates 21 and 22 so disposed as to sandwich the liquid crystal layer, and the like. Moreover, to the liquid crystal display panel 20, a driving circuit board 23 is connected. As described earlier, to the driving circuit board 23, the FPC 7 for supplying electrical power driving the plurality of LEDs 4 is also connected.

Moreover, on the front side of the liquid crystal display panel 20, a front-side case 30 formed out of a metal and the like is disposed. This front-side case 30 has a frame portion 30a and four side portions 30b formed integrally with the frame portion 30a. And in respect of the front-side case 30, the respective four side portions 30b are attached to the side portions 1a-1d of the backlight case 1, thereby to be fixed to the backlight case 1.

In this embodiment, the structure as described above eliminates the need for mounting the capacitor 8 for coping with static electricity on the LED mounting region 6a of the PWB 6, and thus makes it possible to reduce the inconvenience, as a result of securing a space for mounting the capacitor 8 for coping with static electricity on the LED mounting region 6a of the PWB 6, of a region corresponding to that space becoming dark. This helps reduce the occurrence of uneven luminance even when the capacitor 8 for coping with static electricity is also mounted on the PWB 6 on which the plurality of LEDs 4 are mounted.

In this case, the capacitor mounting region 6c of the PWB 6, in which the capacitors 8 for coping with static electricity are mounted, is so formed as to extend along the side surface 3b perpendicular to the side surface (light incident surface) 3a of the light guide plate 3; this helps reduce an increase in the outer dimension of the backlight case 1 even when the capacitor mounting region 6c is newly disposed on the PWB 6. Accordingly, it is possible to reduce an increase in the size of the backlight unit 10.

Thus, in this embodiment, it is possible to reduce, for a case where the capacitor 8 for coping with static electricity is mounted on the PWB 6 in which the plurality of LEDs 4 are mounted, the occurrence of uneven luminance, with no increase in the size of the backlight unit 10.

Moreover, in this embodiment, as described above, the recessed portion 1f for avoiding the contact with the capacitors 8 for coping with static electricity is formed in the side portion 1b of the backlight case 1; this helps reduce the inconvenience of breaking the capacitors 8 for coping with static electricity owing to the contact between the capacitors 8 for coping with static electricity and the side portion 1b of the backlight case 1.

The embodiment disclosed herein should be considered in all respects to be illustrative and not restrictive. The scope of the present invention is set forth by the appended claims rather than by the embodiment specifically described above, and all changes that come within the meaning and range of equivalency of the claims are intended to be embraced herein.

Figure 6:
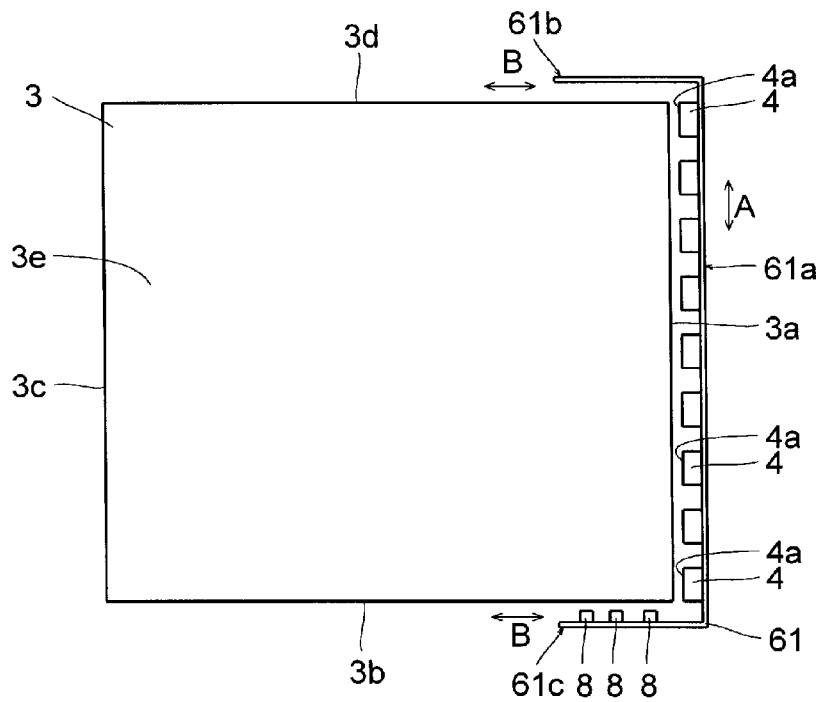
FIG. 6 is a plan view (with a backlight case omitted therefrom) illustrating a structure of a backlight unit of a first modified example of the present invention.

For example, although the foregoing deals with the embodiment in which the plurality of LEDs are mounted on the hardened PWB, this is in no way meant to limit how the present invention is practiced; the plurality of LEDs 4 may be mounted on an FPC (mounting board) 61 like one in a first modified example shown in FIG. 6. In the first modified example shown in FIG. 6, an LED mounting region (first mounting region) 61a of the FPC 61 is so disposed as to face the side surface (light incident surface) 3a of the light guide plate 3. And an FPC mounting region (power supply region) 61b on which an FPC (not shown) for supplying electrical power driving the plurality of LEDs 4 is mounted is formed by bending the FPC 61 along the side surface 3d of the light guide plate 3. Moreover, a capacitor mounting region (second mounting region) 61c on which the plurality of capacitors 8 for coping with static electricity are mounted is formed by bending the FPC 61 along the side surface 3b of the light guide plate 3. Note that in the other respects, the structure of the first modified example is the same as in the above-described embodiment.

Figure 7:
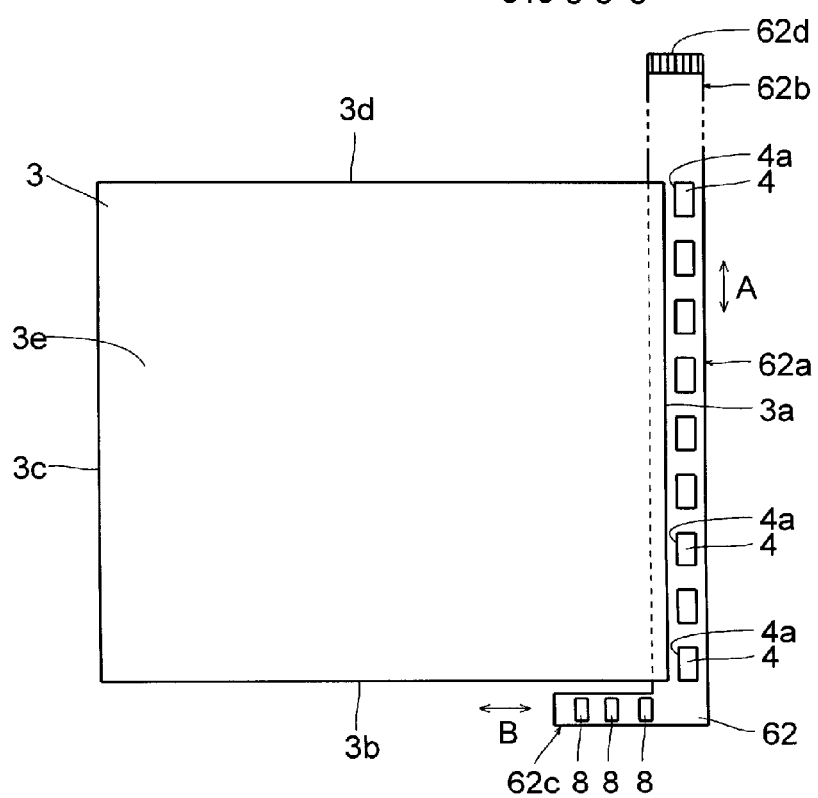
FIG. 7 is a plan view (with a backlight case omitted therefrom) illustrating a structure of a backlight unit of a second modified example of the present invention.

Moreover, as a mounting board on which the plurality of LEDs 4 are mounted, an FPC (mounting board) 62 like one in a second modified example shown in FIG. 7 may be used. In the second modified example shown in FIG. 7, an end portion, on one side, of an LED mounting region 62a of the FPC 62 is provided integrally with a power supply region 62b having a connecting portion 62d that is connected to the driving circuit board 23 (see FIG. 1). And the connecting portion 62d of the FPC 62 is connected to the driving circuit board 23 by bending a boundary portion between the LED mounting region 62a and the power supply region 62b. As in the above-described embodiment, an end portion, on the other side opposite to the one side, of the LED mounting region 62a of the FPC 62 is provided integrally with a capacitor mounting region (second mounting region) 62c extending along the side surface 3b of the light guide plate 3. Note that in the other respects, the structure of the second modified example is the same as in the above-described embodiment.

Figure 8:
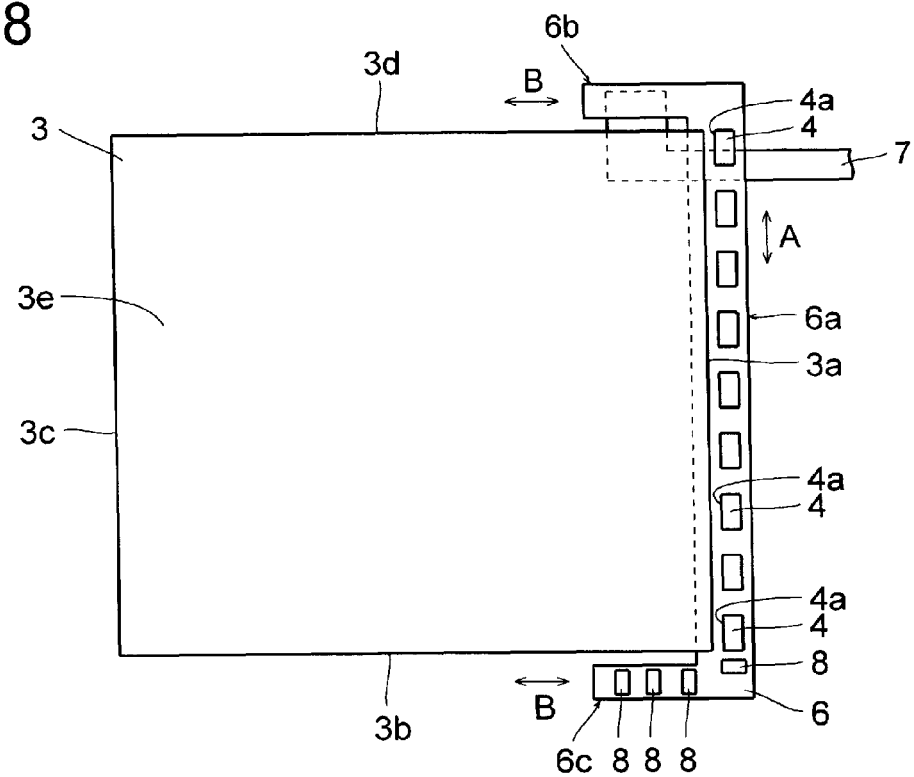
FIG. 8 is a plan view (with a backlight case omitted therefrom) illustrating a structure of a backlight unit of a third modified example of the present invention.

Moreover, although the foregoing deals with the embodiment in which the capacitors for coping with static electricity are mounted on the capacitor mounting region of the PWB alone, this is in no way meant to limit how the present invention is practiced; as in a third modified example shown in FIG. 8, the capacitor 8 for coping with static electricity may be mounted, in addition, to cross over a boundary between the LED mounting region 6a and the capacitor mounting region 6c on the PWB 6.

Figure 9:
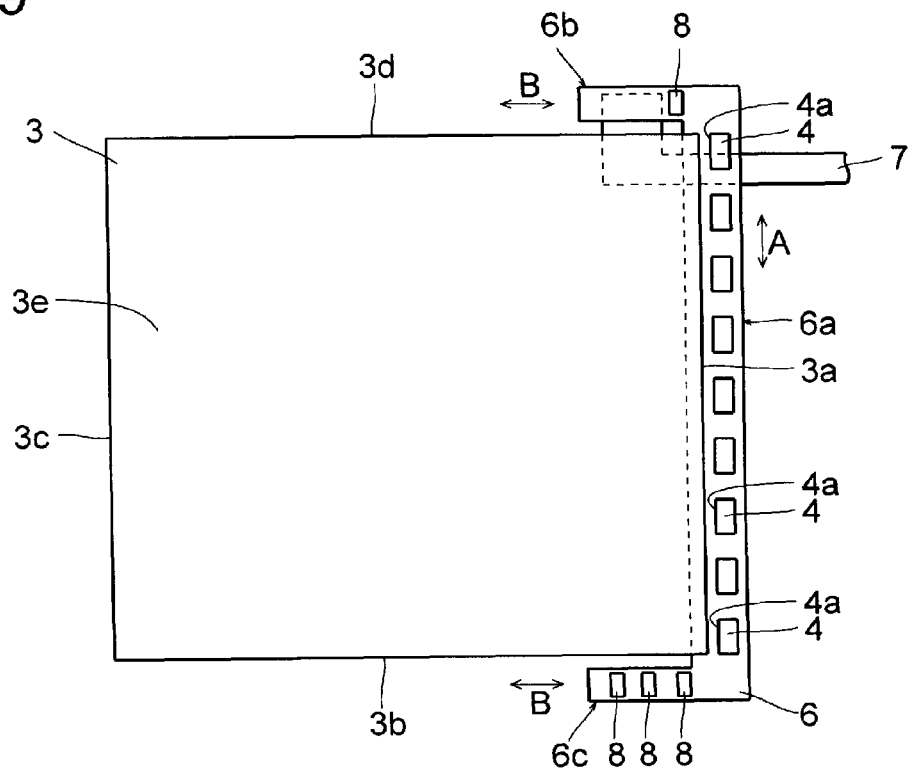
FIG. 9 is a plan view (with a backlight case omitted therefrom) illustrating a backlight unit of a fourth modified example of the present invention.
Figure 10:
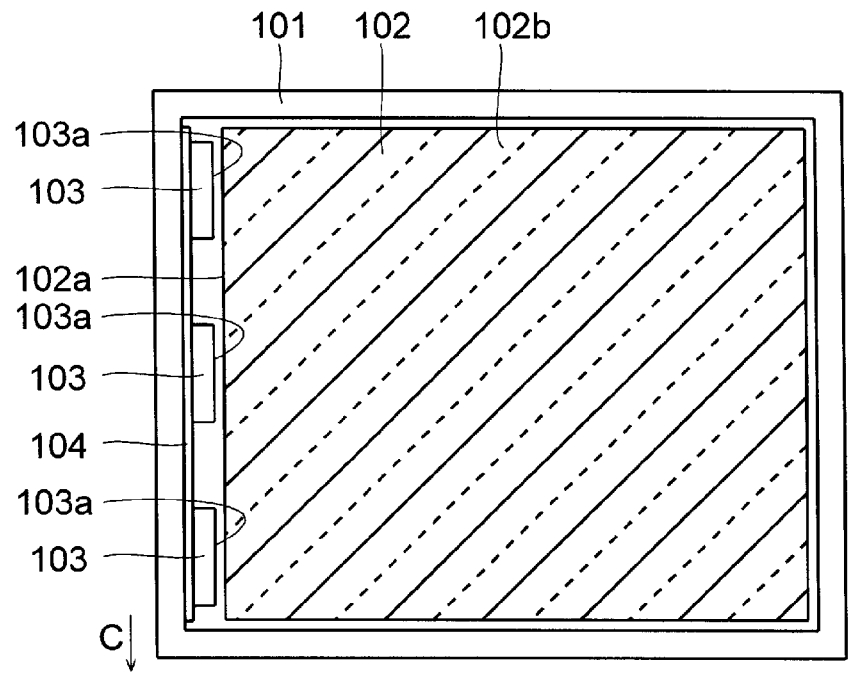
FIG. 10 is a plan view schematically showing an example of a structure of a conventional backlight unit.
Figure 11:
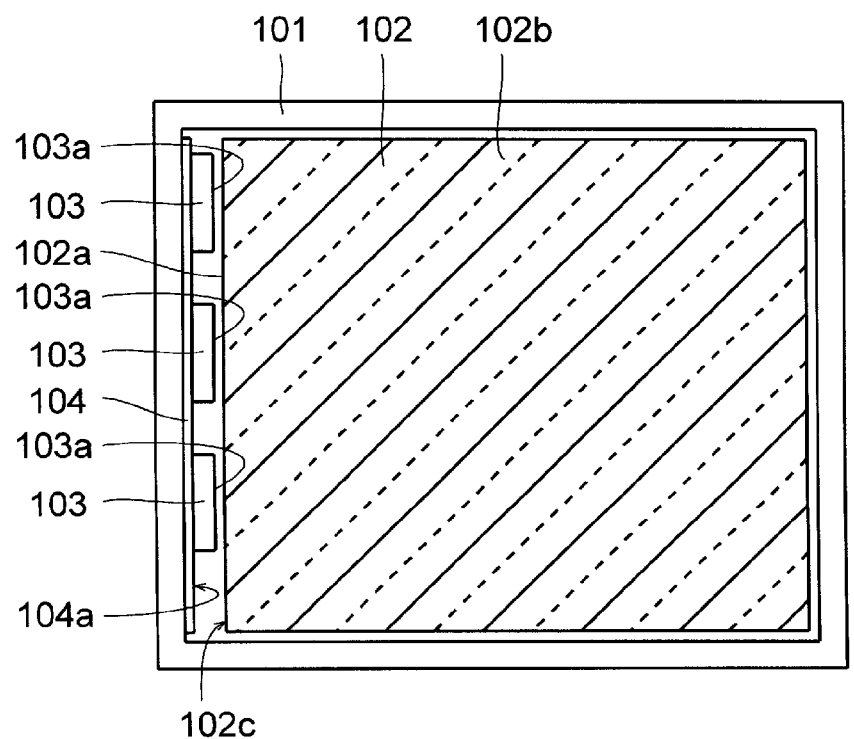
FIG. 11 illustrates problems conventionally encountered with a backlight unit.

Moreover, although the foregoing deals with the embodiment in which the capacitors for coping with static electricity are mounted on the capacitor mounting region of the PWB alone, this is in no way meant to limit how the present invention is practiced; as in a fourth modified example shown in FIG. 9, the capacitor 8 for coping with static electricity may be mounted on the FPC mounting region 6b of the PWB 6 as well.

Moreover, although the foregoing deals with the embodiment in which a capacitor is used as the electronic component for coping with static electricity, this is in no way meant to limit how the present invention is practiced; any electronic component other than the capacitor may be used as the electronic component for coping with static electricity. For example, a Zener diode may be used as the electronic component for coping with static electricity.

The invention claimed is:
1. A backlight unit comprising:
  a light guide plate having four side surfaces, of which a predetermined side surface functions as a light incident surface;

a mounting board having at least a first mounting region extending along the light incident surface of the light guide plate; and a plurality of point light sources mounted on the first mounting region of the mounting board and arranged at a predetermined interval from each other in a direction in which the first mounting region of the mounting board extends, wherein the first mounting region of the mounting board is, at an end portion thereof on one side, provided with a power supply region to which electric power driving the plurality of point light sources is supplied, and the first mounting region of the mounting board is, at an end portion thereof on another side opposite to the one side, provided with a second mounting region a central lengthwise extent of which extends along an outermost side surface of the light guide plate perpendicular to the light incident surface of the light guide plate and that extends from a side of the light incident surface toward a side of, of the four side surfaces of the light guide plate, a side surface opposite from the light incident surface, the second mounting region protruding from the first mounting region in a direction toward the side surface of the light guide plate opposite from the light incident surface, and on the second mounting region of the mounting board, a capacitor or zener diode is mounted for coping with static electricity.

2. The backlight unit according to claim 1, further comprising:

a case member for holding the light guide plate;

wherein the case member has a side portion disposed along a side surface of the light guide plate, and in the side portion of the case member, a recessed portion for avoiding contact between the capacitor or zener diode and the side portion of the case member is formed.

\* \* \* \* \*